United States Patent [19]

Harigaya et al.

[11] 3,912,559

[45] Oct. 14, 1975

[54] COMPLEMENTARY MIS-TYPE SEMICONDUCTOR DEVICES AND METHODS FOR MANUFACTURING SAME

[75] Inventors: Hiroshi Harigaya; Motoyoshi Sakamoto, both of Suwa; Masao Kanai, Shimosuwa, all of Japan

[73] Assignee: Kabushiki Kaisha Suwa Seikosha, Tokyo, Japan

[22] Filed: Mar. 13, 1974

[21] Appl. No.: 450,707

Related U.S. Application Data

[62] Division of Ser. No. 309,858, Nov. 27, 1972, abandoned.

[30] Foreign Application Priority Data

Nov. 25, 1971 Japan .......... 46-94705

[52] U.S. Cl. .......... 148/187; 148/188; 156/17

[51] Int. Cl.$^2$ .......... H01L 21/225

[58] Field of Search .......... 148/187, 188; 156/17

[56] References Cited

UNITED STATES PATENTS

| | | | |
|---|---|---|---|
| 3,461,361 | 8/1969 | Delivorias | 148/187 UX |
| 3,671,338 | 6/1972 | Fujii | 148/187 UX |
| 3,673,679 | 7/1972 | Carbajal et al. | 148/188 X |
| 3,692,571 | 9/1972 | Colton et al. | 148/187 UX |

*Primary Examiner*—L. Dewayne Rutledge
*Assistant Examiner*—J. M. Davis
*Attorney, Agent, or Firm*—Blum, Moscovitz, Friedman & Kaplan

[57] ABSTRACT

An enhancement-type complementary MIS-type semiconductor is provided wherein the absolute value of the threshold voltage does not exceed 1.2 volts in both the P and N channels. The device is formed with either an N-type silicon single-crystal substrate having a specific resistance of more than 30 ohms-cm. and the crystal orientation characterized as "100," or a silicon epitaxial substrate. The gate insulating film is formed from two layers, a silicon oxide film engaging the surface of the substrate and a silicon nitride film on the surface of said silicon oxide film. A vacuum evaporated film of aluminum defines the electroconductive electrodes of the device.

31 Claims, 18 Drawing Figures

COMPLEMENTARY MIS-TYPE SEMICONDUCTOR DEVICES AND METHODS FOR MANUFACTURING SAME

This is a division of application Ser. No. 309,858, filed Nov. 27, 1972 and now abandoned.

BACKGROUND OF THE INVENTION

This invention relates to enhancement-type complementary MIS semiconductor devices operated at low voltages and low power consumption. Such devices can be utilized in electronic wrist watches, including wrist watches incorporating crystal vibrators, portable instruments such as electronic calculators and the like.

It has generally been found that the absolute value of the threshold voltage of a conventional P-channel MIS transistor cannot be lowered to a level less than 1.2 volts where a silicon oxide film provides the main component of the gate insulating film and aluminum is the material selected for the gate electrodes. On the other hand, the threshold voltage of an N-channel MIS transistor can readily be lowered by the relation of the difference of the work function between the silicon substrate and the aluminum, by the space electric charge within the gate insulating film, and the like. Thus, the provision of an enhancement-type complementary MIS semiconductor device capable of operating at low voltages depends on the manufacture of a P-channel MIS transistor of the desired characteristics. By using a multi-layered gate insulating film consisting of a silicon oxide film and a silicon nitride film and by using vacuum evaporated aluminum as the electrode material, a complementary MIS-type semiconductor device is produced wherein the threshold voltage is not over 1.2 volts in both channels.

SUMMARY OF THE INVENTION

Generally speaking, in accordance with the invention, an enhancement-type complementary MIS semiconductor device is provided having a threshold voltage not in excess of 1.2 volts in both the P and N channels thereof. Said device includes either an N-type silicon single-crystal substrate having a specific resistance of more than 30 ohms-cm. and the crystal orientation characterized as "100," or a silicon epitaxial substrate. The gate insulating material is formed from a first layer engaging said substrate consisting of a silicon oxide film and a second layer overlying said first layer and consisting of a silicon nitride film. A vacuum evaporated film of aluminum defines the source, gate, and drain electrodes of said semiconductor device.

The method of manufacture of said semiconductor device is selected so as to reduce the threshold voltage to below the desired level.

Accordingly, an object of the invention is to provide an enhancement-type complementary MIS semiconductor wherein the absolute threshold voltage of both the P and N channels is no greater than 1.2 volts.

A further object of the invention is to provide methods for manufacturing such semiconductor devices.

Still other objects and advantages of the invention will in part be obvious and will in part be apparent from the specification and drawings.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

The difficulty in lowering the threshold voltage of a P-channel MIS transistor results from the difficulty encountered in removing the space electric charge having a positive electric charge existing in the silicon oxide film, and the surface level existing in the interface of the silicon oxide film. The threshold voltage may be represented as follows:

$$V_{th} = -\frac{Q_{ss}}{C_o} - \frac{Q_B}{C_o} + 2\phi_F + \phi_{MS}$$

where, $V_{th}$ = the threshold voltage $C_o$ = the capacitance of the gate insulating film $Q_{SS}$=the space electric charge and the surface level $Q_B$=the space electric charge of the surface depression layer $\phi_F$ = the fermi level of the semiconductor $\phi_{MS}$ = the difference of the work function between the gate metal and the semiconductor and, $Q = \sqrt{2E_{si}.q.N.2\phi_F}$ where, $E_{si}$ = the dielectric constant of the semiconductor $q$= the amount per unit electric charge of an electron $N$= the impurity concentration of the semiconductor substrate.

From the foregoing theoretical expressions, it can be determined that the following elements determine the threshold voltage of a MIS transistor:

1. The form (thickness) and the quality of the material (dielectric characteristics) of the gate insulating film;
2. The impurity concentration of the semiconductor;
3. The quality (work function) of the electroconductive material used for the gate; and
4. The space electric charge and the surface level within the gate insulating film.

The thickness of the gate film is selected between 1,000 A and 1,500 A. Where the gate film is formed of a silicon oxide film of 1,300 A, the relation between the threshold voltage and impurity concentration of the silicon substrate for each of a P-channel and a N-channel transistor has been calculated and graphically presented in FIG. 1. In this example, the gate electroconductive material is aluminum, the work function is 4.2eV, and there is no $Q_{ss}$. From FIG. 1, in the absence of $Q_{ss}$, it is possible to lower the absolute value of the threshold voltage to less than 1.2 volts if the impurity concentration is less than the $1 \times 10^{15}/cm.^3$, the specific resistance being more than 5 ohms-cm. From an examination of FIG. 1, it is apparent that it is easier to lower the threshold voltage of the N-channel transistor than it is to lower the threshold voltage of the P-channel transistor.

In the art, several methods for lowering the threshold voltage of a P-channel MIS transistor have been suggested. Specifically, these methods include the adoption of a film having a negative space electric charge within the gate insulating film such as an alumina film; the adoption of a gate electroconductive material having a work function larger than that of aluminum, such as P-type polysilicon, molybdenum of the like. The methods in accordance with the invention utilize neither of these proposed approaches, but rather, utilize techniques for minimizing $Q_{ss}$.

Figure 1:
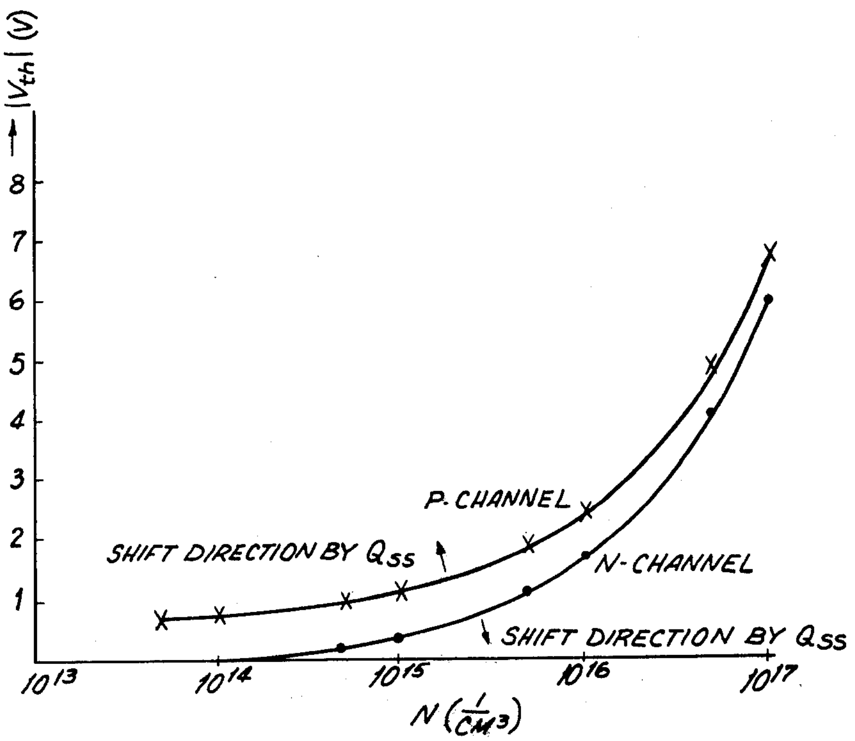
FIG. 1 is a graph showing the relation between impurity concentration of the substrate and the absolute value of the threshold voltage of both the P and N channels of a transistor.
Figure 2A:
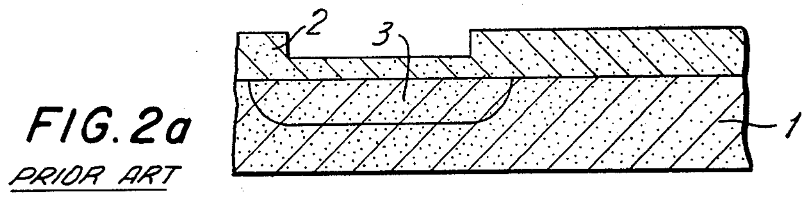
FIG. 2a PRIOR ART
FIGS. 2*a*, 2*b*, 2*c*, 2*d* and 2*e* are sectional views of a conventional complementary MIS semiconductor element.
Figure 2B:
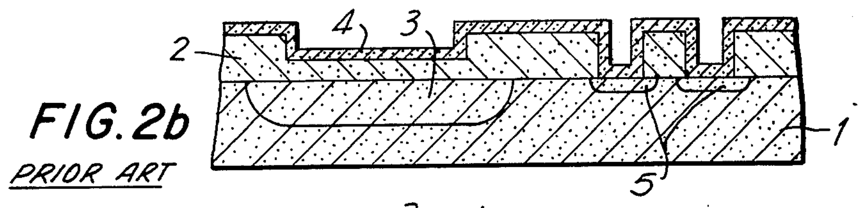
FIG. 2b PRIOR ART
Figure 2C:
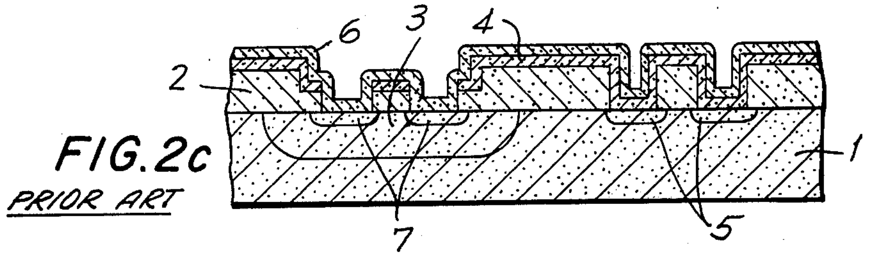
FIG. 2c PRIOR ART
Figure 2D:
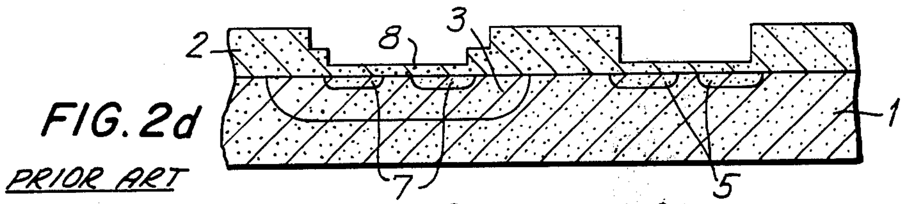
FIG. 2d PRIOR ART
Figure 2E:
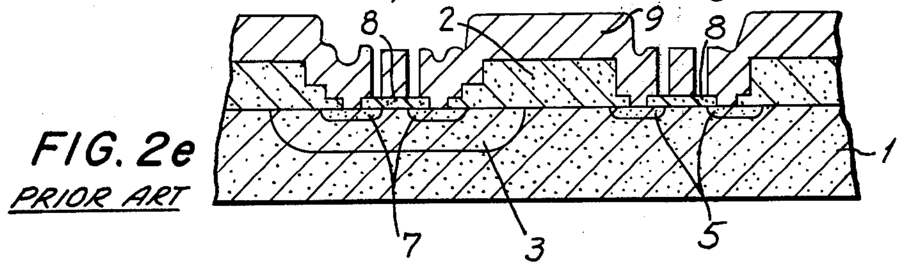
FIG. 2e PRIOR ART

A consideration of FIG. 1 reveals that it is possible to lower the threshold voltage of a P-channel MIS transistor by selecting a substrate having a specific resistance of more than 30 ohms-cm. and an impurity concentration of less than $2 \times 10^{14}/cm.^3$. These criteria are dictated by the fact that the threshold voltage is little changed after the impurity concentration is reduced below this level, and due to manufacturing considerations. The crystal orientations characterized as "100" and "111" are widely used at the present time, but it has been found that the crystal orientation characterized as "100" has the effect of lowering $Q_{ss}$, and this orientation is incorporated in the semiconductor device in accordance with the invention. Referring to FIGS. 2*a* — *e*, the method of manufacturing conventional complementary MIS semiconductor devices is depicted. As shown in FIG. 2*a*, the N-substrate 1 is washed and an oxide film 2 is deposited thereon. By means of the application of photo-etching techniques to oxide film 2 and diffusion techniques, a $P^-$ island 3 for the N-channel is formed. A silicon oxide film doped with boron is generally used as a diffusion source in order to keep the surface concentration low. As shown in FIG. 2*b*, a pair of narrow openings are etched in oxide film 2 in spaced relation in registration with the desired position of the source and drain of the P-channel and a boron oxide film 4 is deposited on the exposed surface of substrate 1 and oxide film 2. By means of heat treatment, the boron is diffused to a high concentration to define the $P^+$ layers 5 defining the source and drain of the P-channel. FIG. 2*c* shows the device after two further narrow openings are etched in the oxide film 2 and boron oxide film 4 in spaced relation overlying $P^-$ island 3 in registration with the desired position of the source and drain of the N-channel. A layer of phosphoric glass is deposited on the exposed surfaces of substrate 1 and boron oxide film 4 and the $N^+$ diffusion layers 7 representing the source and drain of the N-channel are formed in the surface of substrate 1. Film layers 4 and 6, including the impurities, are removed by a light-etcing technique and a silicon oxide film 8 is grown in the gate portion of each of the N and P-channels by an oxidizing process, as shown in FIG. 2*b*. The completed semiconductor device is depicted in FIG. 2*e* after an electro-conductive layer is deposited by aluminum evaporation and alloying, and said layer is divided into source, drain and gate electrodes by photo etching. It has been found that the threshold voltage of the semiconductor devices in question is increased at three points in the manufacturing process, namely, (i) in the process before gate oxidation, (ii) when the gate oxide film is formed, and (iii) after the gate oxide film is formed. By the methods in accordance with the invention, the causes for producing $Q_{ss}$, namely the causes for producing the contamination, have been removed.

Specifically, the method in accordance with the invention requires that, before gate oxidation, the whole surface of the silicon substrate be exposed by removing the silicon oxide film mask used for the boron diffusion and the film such as the boron glass layer. After a suitable time, organic solvent washing by means of acetone, alcohol and the like, and boiling treatment by means of strong mineral acids such as nitric acid and sulfuric acid, and the like, further chemical etching may be performed on the exposed surface of the substrate to a depth of about 1 micron or more. The impurities penetrating into the substrate are removed by the foregoing process. In order to avoid contamination during the period that the gate oxide film is formed, the quartz tube of the oxidizing furnace is first processed so as to remove all contamination adhering thereto or penetrating into said tube. This process consists of passing hydrogen gas through said tube for several hours before use. The contamination which penetrates into the oxide film when the oxide film is grown, as well as the metallic impurities on the surface of the silicon substrate may be removed by flowing hydrogen chloride of several percent or less together with pure oxygen as the oxidizing atmosphere. Any displacement of the contamination in the transverse direction from the gate film at the time of oxidation can be entirely disregarded since the oxidizing process is performed after the etching of the whole surface, which in turn is performed after the diffusion process.

After the oxide film is formed, the largest cause of contamination are the impurities contained in the evaporation filament at the time of aluminum evaporation or in the aluminum itself which penetrate into the silicon oxide film of the gate at the time of such evaporation or during the alloying treatment process after such evaporation. In the semiconductor device in accordance with the invention, a silicon nitride film is interposed between said evaporated aluminum and the silicon oxide film for insulating said silicon oxide film from impurities. The desired characteristics of the semiconductor device in accordance with the invention can be obtained by various combinations of the foregoing procedures as will be discussed in connection with the following embodiments.

Embodiment 1.

Figure 3A:
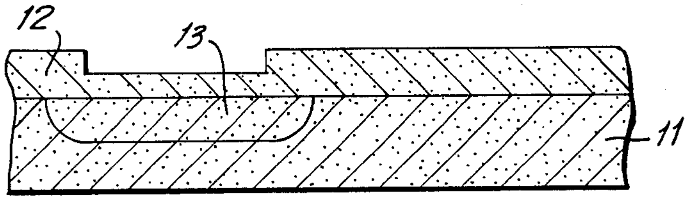
FIGS. 3*a*, 3*b*, 3*c*, 3*d*, 3*e* and 3*f* are sectional views of a complementary MIS semiconductor device in accordance with the invention at various stages of manufacture.
Figure 3B:
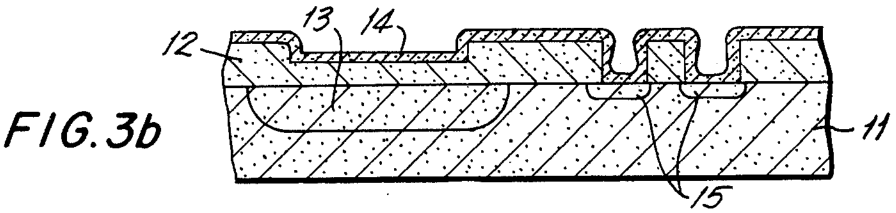

As depicted in FIGS. 3*a* – *f*, the first embodiment of the method of manufacturing enhancement-type complementary MIS semiconductor devices according to the invention is depicted. As shown in FIG. 3*a*, a silicon single-crystal N-type substrate 11 is provided, said substrate having the crystal orientation characterized by "100" and a specific resistance of 40 ohms-cm. The surface of the substrate wafer is polished and a $SiO_2$ film of a thickness of about 10,000 A is grown on said surface by a vapor oxidation method. A portion of the surface of said $SiO_2$ film is removed by photo-etching and the $P^-$layer 13 formed in the surface of substrate 11. Two further narrow, spaced regions of said $SiO_2$ film 12 are removed by photo-etching to expose the surface of substrate 11 in the region thereof which is to form the source and drain of the P-channel. A boron-doped silicon oxide film 14 is then grown on the exposed surface of substrate 11 and silicon oxide film 12, as depicted in FIG. 3*b*. Film 14 is of a thickness of about 4,000 A and is produced by a chemical vapor deposit (CVD) reaction of a $SiH_4$ - $B_2H_6$- $O_2$ system. The diffusion of boron is accomplished continuously at 1,200°C for about two hours within an atmosphere of a $N_2$ gas. In this manner, diffusions areas 15 representing the source and drain of the P-channel are formed. As is described below, the boron glass layer is removed by light-etching techniques and the diffusion of the boron in diffusion area 15 is continued during the growth of a further silicon oxide film 16, which growth is accomplished at 1,200°C over a period of about thirty hours in a mixed gas consisting of about 90 percent $N_2$ and 10% $O_2$ by volume. $P^-$layer 13 is of a depth of about 15 microns and has a surface impurity concentration of $50 \times 10^{15}/cm^3$.

Figures 3C, 3D:
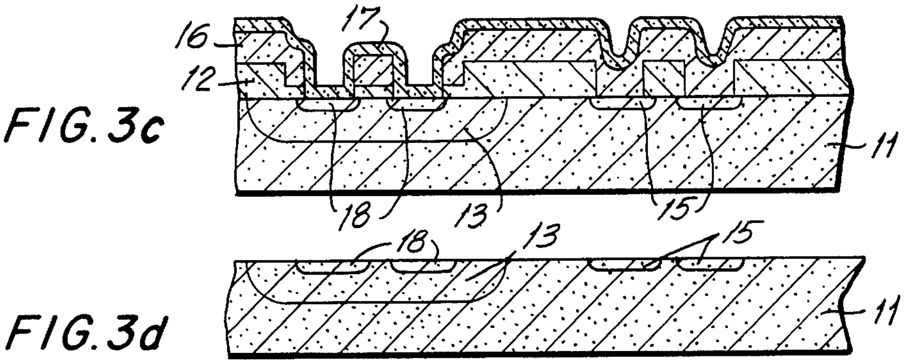

Referring now to FIG. 3*c*, it is seen that boron oxide film 14 and a portion of silicon oxide film 12 are removed by photoetching techniques and a silicon oxide film 16 is grown to a thickness of about 5,000 A by CVD as described above. Two narrow, spaced regions of oxide films 16 and 12 are removed by photo-etching to expose the surface of substrate 11 in the regions which are to define the source and drain on the N-channel. A phosphoric oxide film 17 is deposited on the exposed surfaces of oxide film 12 and substrate 11 and diffusion regions 18 defining said N-channel source and drain are formed by diffusion.

Oxide films 12 and 16 and phosphoric oxide film 17 are all removed from the surface of the substrate by etching in an HF system etching fluid. The exposed surface of substrate 11 is then purified by an organic solvent and subjected to boiling washing by a strong mineral acid such as nitric acid. The resulting product is depicted in FIG. 3*d*.

Figure 3E:
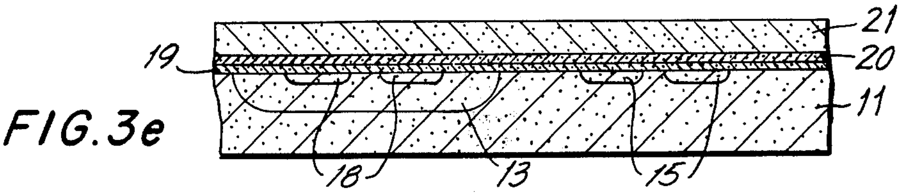

As shown in FIG. 3*e*, a CVD silicon oxide film 19 is grown on the purified surface of the silicon substrate before this thermal oxidizing process, the inside of the quartz tube in which the process is performed is purified by passing hydrogen gas for about five hours through the horizontal quartz tube while said tube is heated to 1,100°C. The hydrogen is then displaced into dry hydrogen by nitrogen gas. The wafer, the form depicted in FIG. 3*d*, is then inserted in the quartz tube and heated for forty minutes to produce a thermal oxide film of a thickness of about 1,000 A. A CVD silicon nitride film 20 is then grown on thermal oxide film 19 to a thickness of about 500 A. in a high-frequency heating furnace at 900°C by means of the reaction of $NH_3$ and $SiH_4$. A CVD silicon oxide film 21 is then formed on the surface of silicon nitride film 20 to a thickness of 8,000 A. by the reaction of $SiH_4$ and $O_2$ at about 400° C. This CVD silicon oxide film makes the thickness of the field large, serves as a mask for the etching of the silicon nitride film, and performs the further duties of preventing the fall of the electrical capacitance and the formation of a parasitic MIS transistor.

Figure 3F:
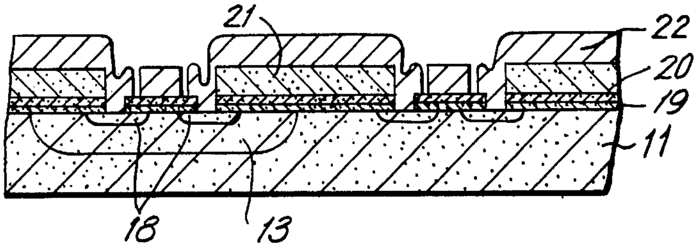

The final product is depicted in FIG. 3*f* wherein two pairs of openings in films 19, 20 and 21 are formed in respective registration with the diffusion layers 18 and 20 to expose the surface of substrate 11 at each of said diffusion layers. These openings are formed by etching, and the portion of the silicon oxide layer 20 between the opening of each pair is likewise exposed to define the gate of each channel. An electro-conductive layer 22 is deposited on the exposed surfaces of the device thus formed through aluminum evaporation and alloying and said layer is cut into segments as shown in FIG. 3*f* to define the source, drain and gate electrodes of each channel.

Figure 4:
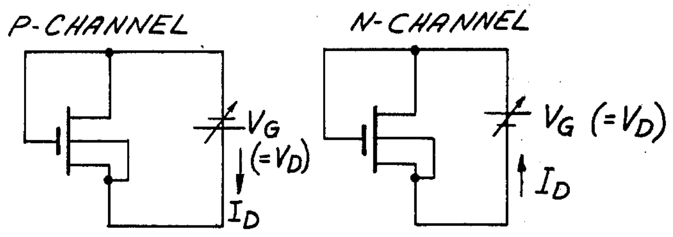
FIG. 4 depicts circuit diagrams of P-channel and N-channel semiconductive devices.
Figure 5:
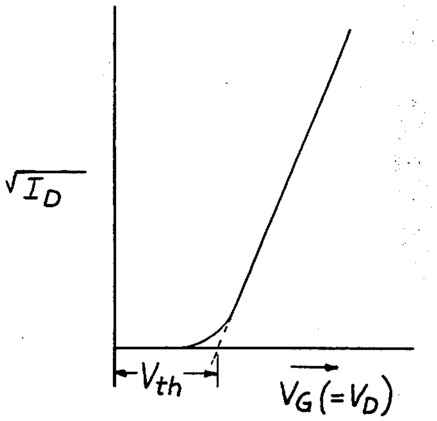
FIG. 5 is a graph showing the characteristics of such devices required to determine the threshold voltage of the transistors of FIG. 4.

FIG. 4 shows a circuit diagram of a P-channel and an N-channel transistor. By consideration of this circuit, the relation between drain current $I_D$ and gate voltage $V_G$ may be determined. The threshold voltage is defined as the gate voltage at the point at which $I_D = 0$ on the extension of the linear portion of the $\sqrt{I_D}$—$V_G$ curve shown in FIG. 5. The threshold voltage of samples manufactured in accordance with the foregoing voltage was found to lie within the range of −0.8 to −1.1 volts in the P-channel and 0.4 to 0.6 volts in the N-channel.

Embodiment 2.

In this embodiment, the original substrate is formed by growing a phosphoris-doped epitaxial layer of about 30 microns in thickness on a wafer having an N-type Si substrate, a crystal orientation characterized by "100" and a specific resistance of 0.10 ohms-cm. Epitaxial growth is achieved by the hydrogen reducing process of $SiCl_4$ in a vertical high-frequency heating furnace with $PH_3$ serving as the dopant. Before epitaxial growth, a gas etching process utilizing HCl is performed to remove about 5 microns of the surface of the basic substrate. The treatment temperature for the formation of said epitaxial layer is 1,180°C. The processes described in connection with embodiment 1 and FIGS. 3*a*, 3*b* and 3*c* are then performed on this epitaxial substrate. After the oxide films are removed as illustrated in FIG. 3*d*, about 1 micron of the surface of the epitaxial silicon is removed by chemical etching through the use of a mixed acid fluid of $HF + HNO_3 + CH_3COOH$. Thereafter, the washing process and the process described in connection with FIGS. 3*e* and 3*f* and embodiment 1 are performed to form a complementary MIS semiconductor device. However, the surface concentration of the $P^-$diffusion layer of this embodiment formed during the steps illustrated in FIG. 3*a* is $1 \times 10^{10}/cm^3$. The threshold voltage of the resulting device is distributed within the range of −0.8 to −1.0 volts in the P-channel and 0.8 to 1.0 volts in the N-channel.

Embodiment 3.

In this embodiment, a silicon substrate such as was used in embodiment 1 is utilized, and the processes described in connection with FIGS. 3*a*, 3*b*, 3*c* and 3*d* and embodiment 1 are performed thereon. However, the gate silicon oxide film 19 is formed by passing oxygen gas and HCl gas in an amount of about 1 percent of said oxygen gas by volume over the substrate surface. By this oxidizing process, a gate silicon oxide film of about 700 A. is produced by treatment at 1,100°C for about 25 minutes. The $Si_3N_4$ film 20 is about 400 A. in this embodiment. The remaining processes are performed in the same manner described in connection with embodiment 1 to define a complementary MIS element. The threshold voltage of this embodiment is distributed within the range of −0.7 to 0.9 volts in the P-channel and 0.3 to 0.5 volts in the N-channel.

Embodiment 4.

Figure 6A:
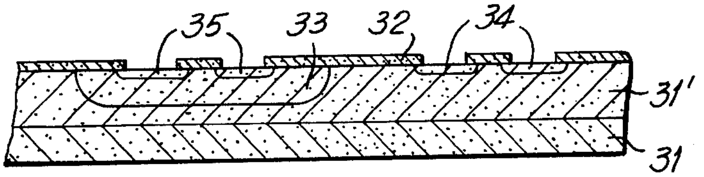
FIGS. 6*a*, 6*b*, 6*c* and 6*d* are sectional views of a second embodiment of the complementary MIS semiconductor device in accordance with the invention.
Figure 6B:
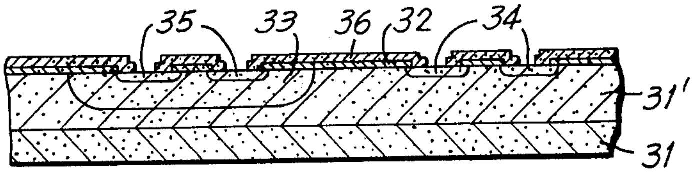
Figure 6C:
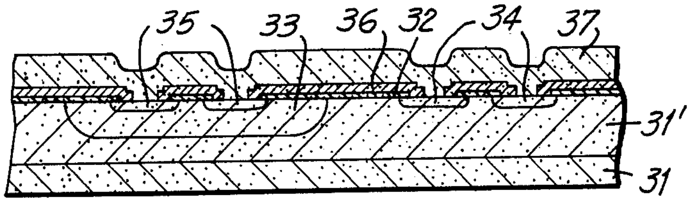
Figure 6D:
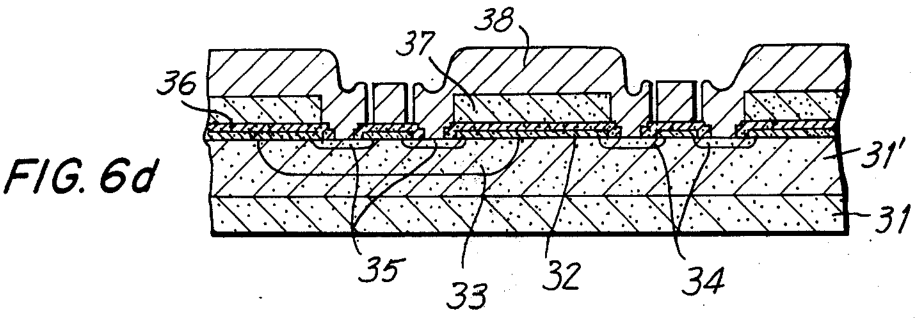

This embodiment is illustrated in connection with FIGS. 6*a* - *d* and utilizes a silicon epitaxial substrate of the kind described in connection with embodiment 2. The preliminary processes described in connection with FIGS. 3*a*, 3*b* and 3*c* and embodiment 1 are performed in like manner in this embodiment. However, the surface impurity concentration of the $P^-$diffusion layer is $6 \times 10^{15}/cm^3$. After the oxide is removed, in the step represented by FIG. 3*d*, 0.5 microns of the surface of the epitaxial layer is removed by etching to produce a basic substrate 31 having an epitaxial layer 31′ deposited thereon as shown in FIG. 6*a*. Diffusion layers 35 and 36 represent the source and drain regions of the N-channel and the P-channel respectively, said $P^-$diffusion layer being represented by reference numeral 33. A silicon oxide layer 32 is deposited on the surface of said epitaxial layer by thermal oxidation utilizing oxygen gas including 1.5% HCl. Film 32 is of a thickness of about 900 A. Portions of film 32 in the region of the respective sources and drains represented by diffusion layers 34 and 35 are then removed by photo-etching as shown in FIG. 6*a*. After rewashing, a $Si_3N_4$ film 36 is grown on the surface of the product of FIG. 6*a* to a thickness of about 400 A. Openings in $Si_3N_4$ film 36 are formed in registration with the diffusion layers 34 and 35 but smaller than the openings previously formed in oxide film 32, as shown in FIG. 6*b*. Thus, not only the upper portions but also the side of the gate oxide film is covered with $Si_3N_4$ film, thereby increasing the contamination prevention effect. As shown in FIG. 6*c*, a CVD silicon oxide film 37 is grown to a thickness of 8,000 A over the entire surface of the product of FIG. 6*b*. The source-drain regions of silicon oxide film 37 are removed by etching as shown in FIG. 6*d* and an aluminum layer 38 is deposited on the surface of the resulting product and alloyed. Portions of the aluminum layer 38 are cut away to define separate source, drain and gate electrodes as shown in FIG. 6*d*, thereby producing the complementary MIS semiconductor device. The threshold voltage of the semiconductor device of FIG. 6*d* has been found to be distributed within the range of −0.75 to −0.9 volts in the P-channel and 0.35 to 0.55 volts in the N-channel.

In order to apply the enhancement-type complementary MIS semiconductor device in accordance with the invention to a one-half divider circuit for a quartz crystal wrist watch, an IC mask is prepared, a sample is made, and the characteristics thereof are examined. The semiconductor device in accordance with the invention has proved to be capable of operation at extremely low power levels, and to be capable of responding up to about 50KHz at 1.5 volts of battery voltage. Accordingly, the arrangement is particularly suited for application to low-voltage and low-power circuit elements.

It will thus be seen that the objects set forth above, among those made apparent from the preceding description, are efficiently attained and, since certain changes may be made in carrying out the above method and in the composition set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. The method of forming an enhancement-type complementary MIS semiconductor device comprising forming a $P^-$ layer on the surface of an N-type silicon single-crystal substrate having a specific resistance of more than 30 ohms-cm and a crystal orientation characterized as "100"; forming source and drain diffusion layers in spaced relation in both said $P^-$ layer portion of the surface of said substrate and the portion of said substrate surface outside of said $P^-$ layer by means of masking and diffusion layers; removing all of said maskins and diffusion layers from the surface of said substrate; washing said substrate surface to remove impurities penetrating into said substrate; forming a silicon oxide film on said washed substrate surface; forming a silicon nitride film on the surface of said silicon oxide film; forming a further silicon oxide film on the surface of said silicon nitride film; forming openings in said silicon oxide and silicon nitride films to expose a portion of the surface of said substrate at each of said sources and drains and the surface of said silicon nitride layer in the gate regions of the device; and forming electroconductive elements in engagement with each of said sources, drains and exposed silicon nitride film layers to define source, drain and gate electrodes for said semiconductor device, whereby the absolute value of the threshold voltage in both the P- and N-channels of said device does not exceed 1.2 volts.

2. The method as recited in claim 1, wherein said source and drain regions are formed in said substrate by depositing a silicon oxide layer on the surface of said substrate; removing a pair of spaced portions of said silicon oxide layer to expose portions of the surface of said substrate at which the source and drain of the P-channel are to be formed; then forming a silicon oxide film doped with boron on the exposed surface of the product of the previous step and diffusing said boron to define a source and a drain; removing the resulting boron glass layer; forming a further silicon oxide film on the exposed surface of the product resulting from the previous step; forming openings in said silicon oxide films to expose portions of the surface of said substrate in said $P^-$ layer at which the N-channel source and drain are to be formed; depositing a phosphoric oxide film on the surface of the product resulting from the previous step and diffusing the phosphorous to define a source and drain in said $P^-$ layer.

3. The method as recited in claim 1, wherein said masking and diffusion films are removed by means of an HF system etching fluid.

4. The method as recited in claim 3, wherein said etching removes a surface layer of said substrate.

5. The method as recited in claim 1, wherein said substrate surface is subjected to organic solvent washing.

6. The method of claim 5, wherein said organic solvent is selected from a group of materials consisting of acetone and alcohol.

7. The method of claim 1, wherein said substrate surface is subjected to boiling treatment in a strong mineral acid.

8. The method as recited in claim 7, wherein said strong mineral acid is selected from the group of materials consisting of nitric acid and sulfuric acid.

9. The method as recited in claim 1, wherein the quartz tube of the oxidizing furnace for forming the silicon oxide film on the washed substrate surface is pretreated by passing hydrogen gas therethrough for a time sufficient to substantially remove contamination adhering to or penetrating into said quartz tube.

10. The method of claim 9, wherein said quartz tube is exposed to said hydrogen gas for about five hours while heated to about 1,100° centigrade.

11. The method as recited in claim 1, wherein said silicon oxide film formed on said washed substrate surface is formed by passing an oxidizing atmosphere consisting of pure oxygen and a small percentage of hydrochloric acid past said surface.

12. The method of claim 11, wherein about 1.5% of said oxidizing atmosphere is HCl.

13. The method as recited in claim 1, wherein said silicon oxide film formed on the surface of said washed substrate is of a thickness between about 700 A and about 1,000 A, and said silicon nitride film is of a thickness between about 400 A and about 500 A.

14. The method of claim 1, wherein portions of said silicon oxide film formed on said washed substrate of a first width in registration with portions of each of said sources and drains are removed; said silicon nitride film is formed on the surface of the product produced by the previous step; portions of said silicon nitride film in registration with the removed portions of said silicon oxide film but of a second width less than said first width then being removed to expose portions of the surface of said substrate in registration with each of said sources and drains so that both the top surface and side edges of said silicon oxide film are encased within said silicon nitride film; said further silicon oxide film being deposited on the surface of the product of the previous step and portions of said further silicon oxide film in registration with the source, drain and gate regions of said semiconductor device being removed.

15. A method for producing an enhancement-type complementary MIS semiconductor device comprising the method of forming an enhancement-type complementary MIS semiconductor device comprising forming a $P^-$ layer on the surface of a silicon epitaxial substrate; forming source and drain diffusion layers in spaced relation in both said $P^-$ layer portion of the surface of said substrate and the portion of said substrate surface outside of said $P^-$ layer by means of masking and diffusion layers; removing all of said masking and diffusion layers from the surface of said substrate; washing said substrate surface to remove impurities penetrating into said substrate; forming a silicon nitride film on the surface of said silicon oxide film; forming a further silicon oxide film on the surface of said silicon nitride film; forming openings in said silicon oxide and silicon nitride films to expose a portion of the surface of said substrate at each of said sources and drains and the surface of said silicon nitride layer in the gate regions of the device; and forming electroconductive elements in engagement with each of said sources, drains and exposed silicon nitride film layers to define source, drain and gate electrodes for said semiconductor device, whereby the absolute value of the threshold voltage in both the P- and N-channels of said device does not exceed 1.2 volts.

16. The method as recited in claim 15, wherein said source and drain regions are formed in said substrate by depositing a silicon oxide layer on the surface of said substrate; removing a pair of spaced portions of said silicon oxide layer to expose portions of the surface of said substrate at which the source and drain of the P-channel are to be formed; then forming a silicon oxide film doped with boron on the exposed surface of the product of the previous step and diffusing said boron to define a source and a drain; removing the resulting boron glass layer; forming a further silicon oxide film on the exposed surface of the product resulting from the previous step; forming openings in said silicon oxide films to expose portions of the surface of said substrate in said $P^-$ layer at which the N-channel source and drain are to be formed; depositing a phosphoric oxide film on the surface of the product resulting from the previous step and diffusing the phosphorous to define a source and drain in said $P^-$ layer.

17. The method as recited in claim 15, wherein said masking and diffusion films are removed by means of an HF system etching fluid.

18. The method as recited in claim 17, wherein said etching removes a surface layer of said substrate.

19. The method as recited in claim 15, wherein said substrate surface is subjected to organic solvent washing.

20. The method of claim 19, wherein said organic solvent is selected from a group of materials consisting of acetone and alcohol.

21. The method of claim 15, wherein said substrate surface is subjected to boiling treatment in a strong mineral acid.

22. The method as recited in claim 21, wherein said strong mineral acid is selected from the group of materials consisting of nitric acid and sulfuric acid.

23. The method as recited in claim 15, wherein the quartz tube of the oxidizing furnace for forming the silicon oxide film on the washed substrate surface is pretreated by passing hydrogen gas therethrough for a time sufficient to substantially remove contamination adhering to or penetrating into said quartz tube.

24. The method of claim 23, wherein said quartz tube is exposed to said hydrogen gas for about five hours while heated to about 1,100° centigrade.

25. The method as recited in claim 15, wherein said silicon oxide film formed on said washed substrate surface is formed by passing an oxidizing atmosphere consisting of pure oxygen and a small percentage of hydrochloric acid past said surface.

26. The method of claim 25, wherein about 1.5 percent of said oxidizing atmosphere is HCl.

27. The method as recited in claim 15, wherein said silicon oxide film formed on the surface of said washed substrate is of a thickness between about 700 A and about 1,000 A, and said silicon nitride film is of a thickness between about 400 A and about 500 A.

28. The method of claim 15, wherein portions of said silicon oxide film formed on said washed substrate of a first width in registration with portions of each of said sources and drains are removed; said silicon nitride film is formed on the surface of the product produced by the previous step; portions of said silicon nitride film in registration with the removed portions of said silicon oxide film but of a second width less than the first width then being removed to expose portions of the surface of said substrate in registration with each of said sources and drains so that both the top surface and side edges of said silicon oxide film are encased within said silicon nitride film; said further silicon oxide film being deposited on the surface of the product of the previous step and portions of said further silicon oxide film in registration with the source, drain and gate regions of said semiconductor device being removed.

29. The method as recited in claim 15, including the further step of chemically etching a surface layer of said epitaxial silicon by means of a mixed acid fluid based on HF.

30. The method as recited in claim 29, wherein said mixed acid fluid includes $HF + HNO_3 + CH_3COOH$.

31. The method as recited in claim 29, wherein up to about 1 micron of the surface of said epitaxial silicon is removed by said chemical etching.

* * * * *